(12) United States Patent
Ji et al.

(10) Patent No.: US 9,562,816 B2
(45) Date of Patent: Feb. 7, 2017

(54) APPARATUS FOR INSPECTING MAGAZINE INCLUDING STOPPER

(71) Applicant: Samsung Electronics Co., Ltd., Suwon-si (KR)

(72) Inventors: Chang-hwan Ji, Cheonan-si (KR); Jung-hun Choi, Gumi-si (KR); Sung-yeol Lee, Cheonan-si (KR); Hee-sang Yang, Asan-si (KR); Jae-nam Lee, Asan-si (KR)

(73) Assignee: Samsung Electronics Co., Ltd. (KR)

( * ) Notice: Subject to any disclaimer, the term of this patent is extended or adjusted under 35 U.S.C. 154(b) by 2 days.

(21) Appl. No.: 14/463,742

(22) Filed: Aug. 20, 2014

(65) Prior Publication Data

US 2015/0053595 A1    Feb. 26, 2015

(30) Foreign Application Priority Data

Aug. 23, 2013  (KR) ........................ 10-2013-0100571

(51) Int. Cl.
| | |
|---|---|
| *G01L 3/10* | (2006.01) |
| *B07C 5/34* | (2006.01) |
| *E05B 65/46* | (2006.01) |
| *H05K 7/14* | (2006.01) |
| *G01M 5/00* | (2006.01) |
| *G01L 5/16* | (2006.01) |
| *H01L 21/67* | (2006.01) |

(52) U.S. Cl.
CPC ................ *G01L 3/108* (2013.01); *B07C 5/34* (2013.01); *B07C 5/3404* (2013.01); *E05B 65/468* (2013.01); *G01L 5/16* (2013.01); *G01M 5/0033* (2013.01); *G01M 5/0075* (2013.01); *H01L 21/67271* (2013.01); *H01L 21/67288* (2013.01); *H05K 7/1408* (2013.01)

(58) Field of Classification Search
CPC .......... B07C 5/34; B07C 5/3404; H01L 21/67; H01L 21/67242; H01L 21/67265; H01L 21/67271; H01L 21/67288; H01L 21/673; H01L 21/6732; G01N 19/00; H05K 7/1408; E05B 65/468; E05B 65/465; E05B 65/467
See application file for complete search history.

(56) References Cited

U.S. PATENT DOCUMENTS

| | | | |
|---|---|---|---|
| 6,163,145 A | 12/2000 | Yamada et al. | |
| 6,591,162 B1 * | 7/2003 | Martin | .............. H01L 21/67242 700/225 |
| 6,595,075 B1 * | 7/2003 | Shien | ................ H01L 21/67259 206/710 |
| 7,596,456 B2 * | 9/2009 | Mollenkopf et al. | ........... 702/34 |

(Continued)

FOREIGN PATENT DOCUMENTS

| | | |
|---|---|---|
| JP | 2010109197 | 5/2010 |
| JP | 2012183456 | 9/2012 |

(Continued)

*Primary Examiner* — Luis A Gonzalez
(74) *Attorney, Agent, or Firm* — Onello & Mello, LLP

(57) ABSTRACT

Provided is an apparatus for inspecting a magazine including a plurality of partially-finished products. The apparatus is configured to inspect a stopper of the magazine before providing the magazine to a packaging process, and further configured to classify the stopper into a normal product. The magazine comprising the stopper classified as the normal product is into the packaging process.

19 Claims, 19 Drawing Sheets

(56) References Cited

U.S. PATENT DOCUMENTS

| | | | |
|---|---|---|---|
| 2004/0108284 A1* | 6/2004 | Huang et al. | 211/41.18 |
| 2005/0263443 A1* | 12/2005 | Martin | G01N 21/93 |
| | | | 209/522 |
| 2006/0099058 A1* | 5/2006 | Choi | 414/416.08 |
| 2009/0175706 A1* | 7/2009 | Lee | H01L 21/67259 |
| | | | 414/217 |
| 2011/0259840 A1 | 10/2011 | Park et al. | |
| 2012/0255209 A1 | 10/2012 | Klassen | |
| 2013/0024544 A1 | 1/2013 | Oshita | |
| 2013/0061505 A1 | 3/2013 | Faifer | |
| 2013/0329540 A1 | 12/2013 | Yoshida | |
| 2014/0178162 A1* | 6/2014 | Morikawa et al. | 414/416.08 |

FOREIGN PATENT DOCUMENTS

| | | |
|---|---|---|
| JP | 2012208996 | 10/2012 |
| KR | 100196646 | 2/1999 |
| KR | 2001066502 | 9/2009 |
| KR | 2009093150 | 9/2009 |
| KR | 100962006 | 6/2010 |
| KR | 2011138666 | 12/2011 |

\* cited by examiner

APPARATUS FOR INSPECTING MAGAZINE INCLUDING STOPPER

CROSS-REFERENCE TO RELATED APPLICATIONS

This application claims the benefit of Korean Patent Application No. 10-2013-0100571, filed on Aug. 23, 2013, in the Korean Intellectual Property Office, the disclosure of which is incorporated herein in its entirety by reference.

BACKGROUND

1. Field

The inventive concept relates to an apparatus for inspecting a magazine, and more particularly, to a magazine inspection apparatus for inspecting a magazine including an element such as a stopper.

2. Description of Related Art

Manufacturing a semiconductor package may include a front-end process including a semiconductor chip attachment process and a wire bonding process that is performed. Half-finished semiconductor package products having a strip shape are subsequently transferred to undergo a back-end process including molding, trimming, forming, and ink marking. In the back-end process, a magazine is used as a device for transporting and transferring partially-finished products stored and deposited, while protecting the partially-finished products from mechanical, physical, and electric impacts.

SUMMARY

The inventive concept provides a magazine inspection apparatus capable of automatically inspecting a defect of a magazine used in a back-end process and removing a defective magazine, thereby improving efficiency of production facilities.

According to an aspect of the inventive concept, there is provided an apparatus for inspecting a magazine including a plurality of partially-finished products. The apparatus comprises a stopper that locks or unlocks the partially-finished products; a position detector configured to detect a position of the stopper; a pressure detector configured to detect a pressure that, when generated, applies a force to the stopper; and a torque detector configured to detect a torque amount that, when generated, rotates the stopper. The apparatus is configured to inspect whether the position, the pressure, and the torque amount satisfy a set of predefined conditions, respectively, and, in response, to classify the magazine as either normal or defective.

In some embodiments, the position detector is configured to detect the stopper in at least one of a first position at a first state and a second position at a second state.

In some embodiments, the first state is a first unlocked state and the second state is a second unlocked state. The first unlocked state is an unlocked state in which the stopper is located in a groove of the magazine before pressure and torque inspection operations are performed to determine whether the stopper normally operates based on the pressure and the torque amount, respectively. The second unlocked state is an unlocked state in which the stopper is located in the groove of the magazine after performing the pressure and torque inspection operations.

In some embodiments, the torque detector includes a load cell comprising at least one of a piezoelectric device and a strain gauge, a first asymmetrical connection unit coupled to the stopper, and a second asymmetrical connection unit coupled to the load cell. The first asymmetrical connection unit and the second asymmetrical connection unit engage each other.

In some embodiments, the torque detector is configured to rotate the first asymmetrical connection unit and the stopper by rotating the second asymmetrical connection unit, and wherein the load cell measures a pressure when the stopper is not rotated, thereby measuring the torque amount.

In some embodiments, the apparatus furthers include a communication unit configured to fill in defective information on a tag device of the magazine classified as defective.

According to another aspect of the inventive concept, there is provided an apparatus for inspecting a magazine including a plurality of partially-finished products. The apparatus is configured to inspect a stopper of the magazine before providing the magazine to a packaging process, and further configured to classify the stopper into a normal product, and to input only the magazine comprising the stopper classified the normal product into the packaging process.

In some embodiments, the apparatus includes a first position detector configured to detect a first position of the stopper. The apparatus is configured to classify the stopper into the normal product when the first position satisfies a predetermined condition.

In some embodiments, the first position detector includes a laser sensor configured to detect the first position by emitting a laser at a top surface of the stopper and detecting a reflection amount of the laser. In some embodiments, the apparatus includes a second position detector configured to detect a second position of the stopper. The apparatus is configured to classify the stopper into the normal product when the second position satisfies a predetermined condition.

In some embodiments, the apparatus includes a pressure detector configured to detect a pressure generated by pushing the stopper. The apparatus may be configured to classify the stopper into the normal product when the pressure satisfies a certain condition. In some embodiments, the pressure detector includes at least one of a piezoelectric device and a strain gauge.

In some embodiments, the apparatus includes a torque detector configured to detect a torque amount generated by rotating the stopper. The apparatus may be configured to classify the stopper into the normal product when the torque amount satisfies a predetermined condition. In some embodiments, the torque detector is configured to measure the torque amount by measuring a pressure generated when a rotational force is applied to the stopper but the stopper does not rotate.

According to another aspect of the inventive concept, there is provided an apparatus for inspecting a magazine, comprising a detection unit, a communication unit, and a classification unit. The detection unit detects information regarding whether an element of the magazine is defective. The communication unit processes a signal that includes information on a type of defect occurring at the element of the magazine. The classification unit classifies the magazine as either normal or defective according to the information of the signal.

In some embodiments, the element of the magazine includes a stopper that locks or unlocks partially-finished products in the magazine, and wherein the detection unit comprises at least one of a position detector configured to detect a position of the stopper, a pressure detector configured to detect a pressure that, when generated, applies a force to the stopper, and a torque detector configured to detect a torque amount that, when generated, rotates the stopper.

In some embodiments, the apparatus inspects the stopper of the magazine before providing the magazine to a packaging process, and inputs the magazine classified as normal into the packaging process.

In some embodiments, the position detector is configured to detect the stopper in at least one of a first position at a first unlocked state and a second position at a second unlocked state. The first unlocked state is an unlocked state in which the stopper is located in a groove of the magazine before pressure and torque inspection operations are performed to determine whether the stopper normally operates based on the pressure and the torque amount, respectively. The second unlocked state is an unlocked state in which the stopper is located in the groove of the magazine after performing the pressure and torque inspection operations.

In some embodiments, the apparatus further comprises a first transfer unit, a second transfer unit, and a third transfer unit. The classification unit transfers the magazine from the first transfer unit to the second transfer unit in response to the magazine classified as normal. The classification unit transfers the magazine from the first transfer unit to the third transfer unit in response to the magazine classified as defective.

In some embodiments, the apparatus further comprises a control unit that determines whether the magazine is defective by receiving the signal from the detection unit.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
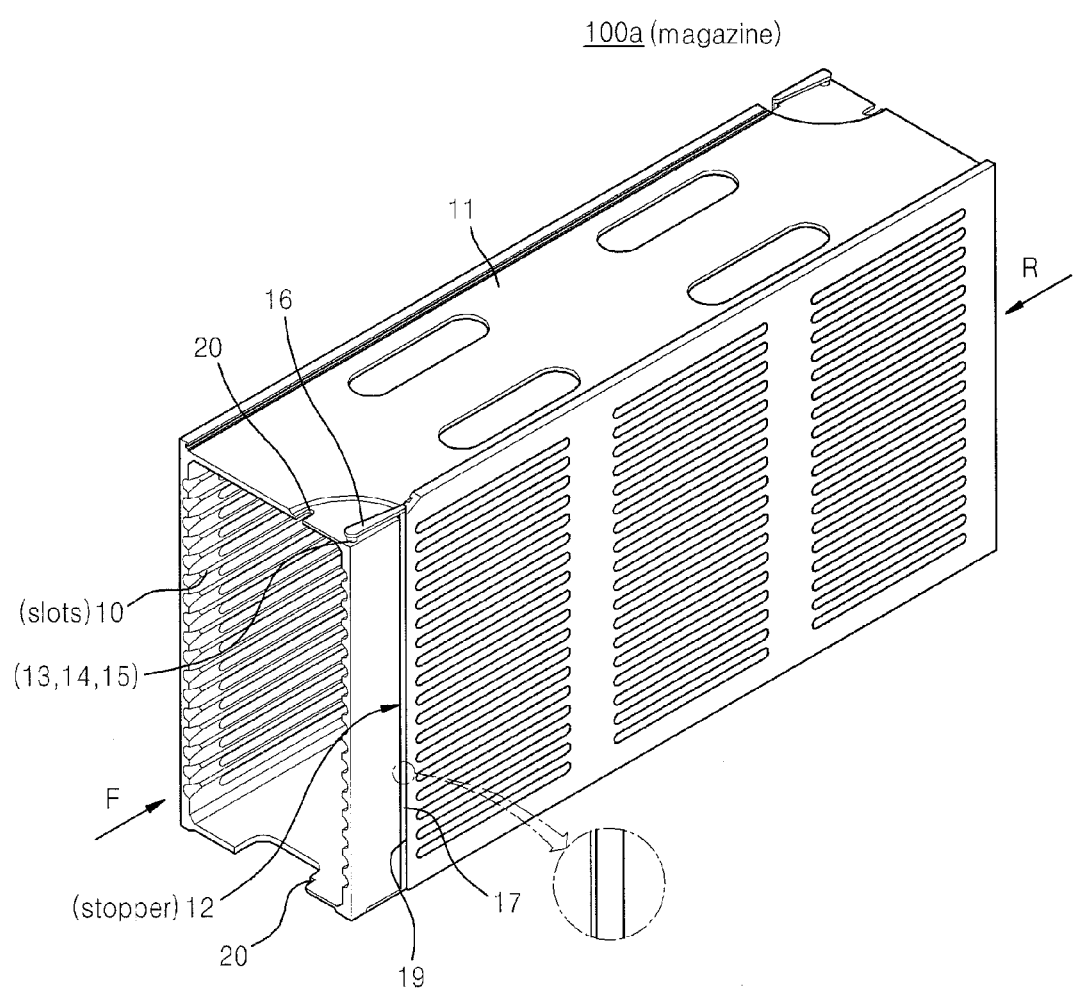
FIGS. 1 to 4 are schematic views illustrating magazines that are a target of a magazine inspection apparatus.

As used herein, the term "and/or" includes any and all combinations of one or more of the associated listed items. Expressions such as "at least one of," when preceding a list of elements, modify the entire list of elements and do not modify the individual elements of the list.

Hereinafter, exemplary embodiments of the inventive concept will be described in detail with reference to the attached drawings.

The embodiments of the inventive concept are provided to more perfectly explain the inventive concept to a person with ordinary skill in the art, and following embodiments may be variously changed but the scope of the inventive concept is not limited thereto. The embodiments are provided to allow the present disclosure to be more faithful and full and to perfectly transfer the inventive concept to those skilled in the art.

Terms used in the specification are used to described particular embodiments and do not limit the inventive concept. As used herein, the singular forms "a," "an" and "the" are intended to include the plural forms as well, unless the context clearly indicates otherwise. It will be further understood that the terms "comprises" and/or "comprising" used herein specify the presence of stated shapes, numbers, operations, elements, and/or a group thereof, but do not preclude the presence or addition of one or more other shapes, numbers, operations, elements, and/or groups thereof. As used herein, the term "and/or" includes any and all combinations of one or more of the associated listed items.

It will be understood that although the terms "first", "second", etc. may be used herein to describe various components, these components should not be limited by these terms. The terms do not mean a particular order, top and bottom, or merits and demerits but are only used to distinguish one component from another. Accordingly, a first element, area, or portion that will be described below may indicate a second element, area, or portion without deviating from teachings of the inventive concept.

Hereinafter, embodiments of the inventive concept will be described with reference to drawings. In the drawings, for example, according to manufacturing technologies and/or tolerances, illustrated shapes may be modified. Accordingly, the embodiments of the inventive concept will not be understood to be being limited to certain shapes of illustrated areas but will include variances in shapes caused while being manufactured.

Before describing the inventive concept, magazines that are a target of a magazine inspection apparatus, particularly, magazines including a stopper will be described with reference to FIGS. 1 to 4. Although the following description refers to embodiments that include a magazine stopper, other related elements can equally apply.

A stopper is a mechanical structure installed in a magazine to prevent partially manufactured or incomplete products, referred to herein as half-finished products, positioned in the magazine from being separated or damaged. For example, referring to FIGS. 1 and 2, a magazine 100a may include a body 11 having a plurality of slots 10 on both inner sidewalls thereof and a bar-shaped stopper 12 disposed at least one of an open front and rear surface of the body 11. The stopper 12 may include a horizontal element 16 and a vertical element 17. The stopper 12 may be installed on both front and rear surfaces of the body 11, and serve as an opening/closing unit.

The stopper 12 may be positioned in a groove 14 of the body 11 according to a pin 13 formed on top and bottom thereof. The stopper 12 may rotate around the pin 13. For example, when a pressure is not applied to a spring 15 mounted on the pin 13 (a part of a solid line shown in FIG. 2), the stopper 12 is mechanically combined with an inner fastening portion (not shown) and does not rotate. When a pressure is applied to the spring 15 in a vertical direction (a part of a dotted line shown in FIG. 2), the stopper 12 may be out of a mechanical combination with the inner fastening portion and may rotate.

The contained half-finished products may be unlocked or locked by the stopper 12. When the stopper 12 is fastened to a first mounting portion 19 of the body 11, the contained half-finished products are unlocked. In order to etch the half-finished products while in an unlocked state, argon or plasma may be inserted into the body 11. On the other hand, when the stopper 12 is fastened to a second mounting portion 20 of the body 11, the contained half-finished products are locked. During a locked state, the stopper 12 prevents the half-finished products from being separated outwardly or being damaged.

Figure 2:
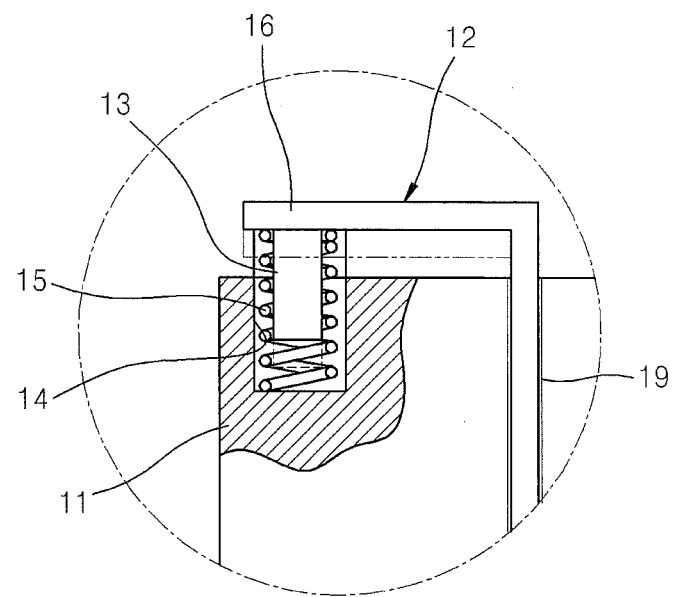
Figure 3:
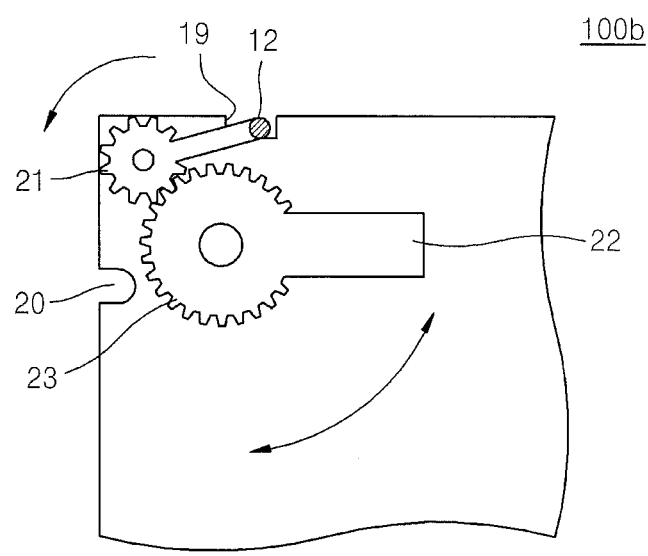
Figure 4:
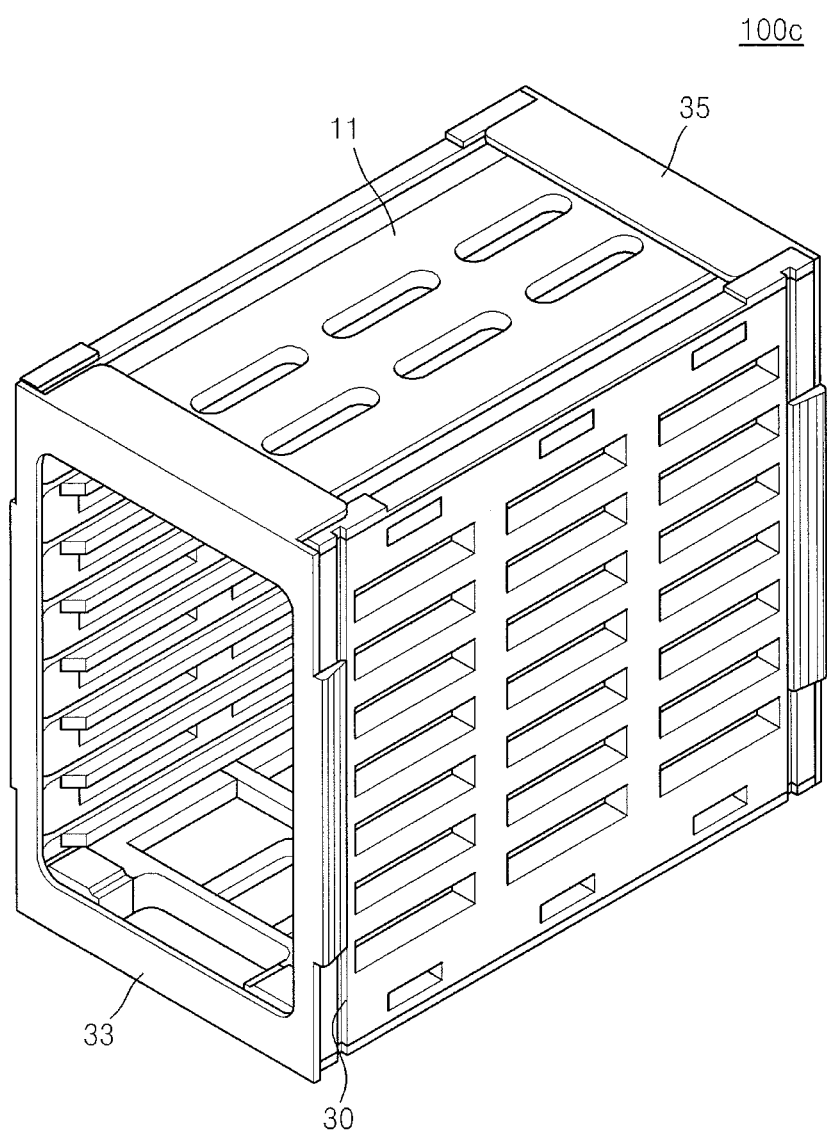

A magazine inspection apparatus may be applied to magazines having other structures in addition to the magazine 100a shown in FIGS. 1 and 2. For example, as shown in FIG. 3, a magazine inspection apparatus may be used for a magazine 100b having a configuration in which when rotating a knob 22, a driving gear 23 combined with both the knob 22, and a driven gear 21 engaged with the driving gear 23 rotate. The stopper 12 combined with the driven gear 21 rotates and transfers from the first mounting portion 19 to the second mounting portion 20. In addition, as shown in FIG. 4, the magazine inspection apparatus may be used for a magazine 100c having a configuration in which a plurality of guide grooves 30 are formed on both sides of and opening of the body 11. Cover-shaped stoppers 33 and 35 can transfer along the guide grooves 30, thereby opening and closing an opening of the body 11.

Figure 5:
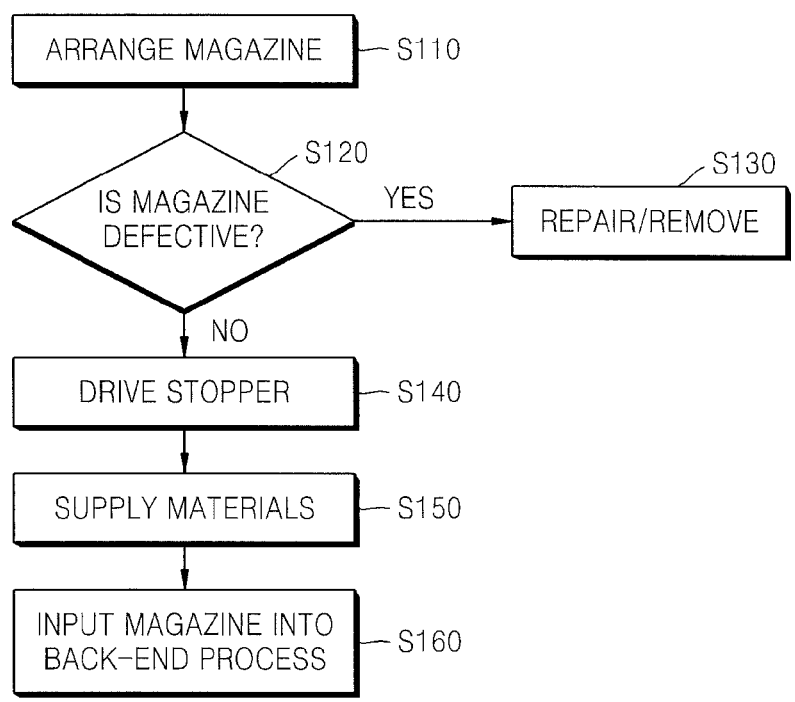
FIG. 5 is a flowchart illustrating a magazine inspecting method according to embodiments of the inventive concept.

FIG. 5 is a flowchart illustrating a magazine inspecting method according to embodiments of the inventive concept.

Referring to FIG. 5, a magazine is provided and arranged (S110). The magazine may have one or more various shapes, which may or may not be of a different shape than the magazines described with reference to FIGS. 1 to 4.

A determination is made whether the magazine is defective or not (S120). For example, inspections may be performed regardless of whether the magazine is damaged, and more particularly, whether a stopper included in the magazine is located in a regular position thereof, and whether incorrect operations are performed or not. When the magazine is determined to be defective, the magazine is not inputted into a back-end process. The magazine can be repaired or removed when a determination is made that the magazine is defective, and repair is impossible (S130).

The magazine determined at step S120 to be normal may be inputted into the back-end process (S160). The magazine can be considered normal when the magazine, or more specifically, elements of the magazine such as a stopper, are deemed error-free or otherwise non-defective. In order to input the magazine into a back-end process, the stopper of the magazine is driven to transitions between states, for example, a locked state transitioned to an unlock state (S140), whereby materials such as half-finished products are supplied to the magazine (S150). The operation of driving the stopper (S140) before the operation of inputting the magazine into the back-end process (S160) may be omitted. For example, a magazine determined to be of normal quality in the operation of inspecting the defect (S120) may be in the unlocked state. Accordingly, with no additional operation of driving the stopper (S140), the operation of supplying the materials (S150) is performed, and the magazine is input into the back-end process (S160).

In an example of a semiconductor assembling process, twenty thousand magazines are used for each process line to include and process half-finished products. For example, when total lines are six, 120,000 magazines are used. In the case, a defect is generated by, for example, overload and expiration of lifespan of manufacturing facilities and distribution apparatuses and careless handling. Defects related to the magazine can prevent manufacturing facilities and distribution apparatuses from normally operating, thereby causing errors in process and suspending the manufacturing process. Accordingly, overall production efficiency and quality of products are encumbered.

In general production methods, a magazine containing half-finished products is transferred while it is unknown whether the magazine is normal or not. Accordingly, when an error occurs in an opening/closing unit such as a stopper while supplying materials, a user manually inspects defects of the magazines. In order to perform such inspections, it is necessary to suspend an assembling process, thereby decreasing production efficiency.

According to the magazine inspection method according to the inventive concept, before being inputted into a process, magazines are previously inspected, thereby sorting out defective magazines and inputting normal magazines into a back-end process. Accordingly, it is possible to overcome limitations of general inspection methods such as suspending a process and manually removing defective magazines from the process to decrease efficiency of production facilities.

Also, in the magazine inspection apparatus according to the embodiments, a basis of quality control may be established from a general relative reference by a person to a quantifiable reference such as a load cell, thereby more precisely and efficiently detecting defects. Also, damages associated with half-finished products caused by defects of magazines may be prevented, thereby increasing quality of finished products.

Figure 6:
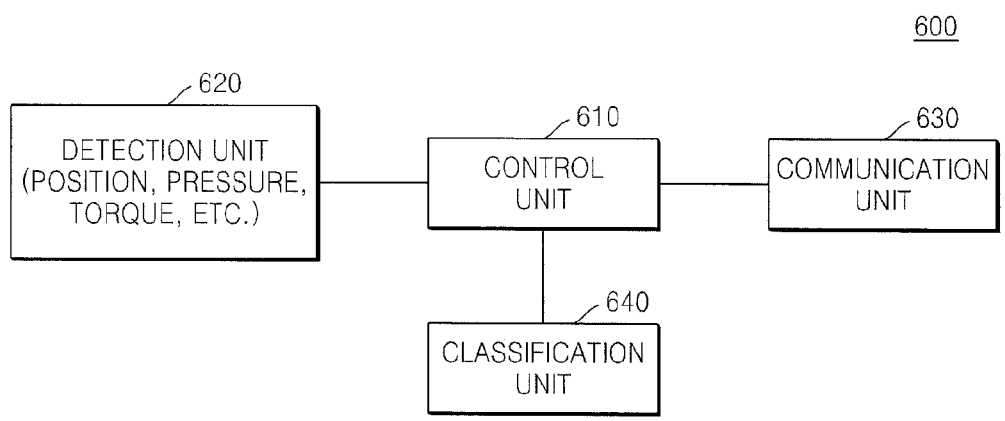
FIG. 6 is a block view illustrating a magazine inspection apparatus according to embodiments of the inventive concept.

FIG. 6 is a block view illustrating a magazine inspection apparatus 600 according to embodiments of the inventive concept.

Referring to FIG. 6, the magazine inspection apparatus 600 may include a control unit 610, a detection unit 620, a communication unit 630, and a classification unit 640. The control unit 610 may be configured to control the detection unit 620, the communication unit 630, and the classification unit 640, respectively. Hereinafter, operations of the detection unit 620, the communication unit 630, and the classification unit 640, performed by controlled by the control unit 610, will be described.

The detection unit 620 may be configured to detect whether a target magazine is defective or not, and more particularly, whether a stopper of the magazine is defective or not. For example, the detection unit 620 may be configured to detect at least one of i) whether the stopper of the magazine is normally located or not, ii) when a pressure is applied to the stopper, the stopper normally pushes or not, and iii) when a rotational force is applied to the stopper, the stopper normally rotates or not. The detection unit 620 may include a position detector, a pressure detector, and/or torque detector to detect whether the target magazine is effective.

The embodiment has been described focusing on detecting whether the stopper of the magazine is defective or not but is not limited thereto. That is, the detection unit 620 may be configured to detect whether other elements of the magazine in addition to the stopper are defective or not. For example, when a transfer member such as a wheel is attached to the magazine, the detection unit 620 may be configured to detect a defect of the transfer member or may be configured to detect a defect of a component (not shown) related to a slot (see for example slot 10 shown in FIG. 1) in the magazine.

The control unit 610 may determine whether the magazine is defective by receiving a signal from the detection unit 620 and transferring related data to the communication unit 630, for example, normal or defective product information. For example, when the magazine is defective, information on a kind of a defect occurring at the stopper, that is, due to the cause of the defect among a position, a pressure, and a rotation, may be transferred to the communication unit 630. The communication unit 630 may be configured to receive the normal/defective product information and to fill in the information on a tag device of the magazine. Accordingly, the type the defect of the magazine may be recognized from the normal/defective product information of the magazine stored at the tag device.

Figure 7:
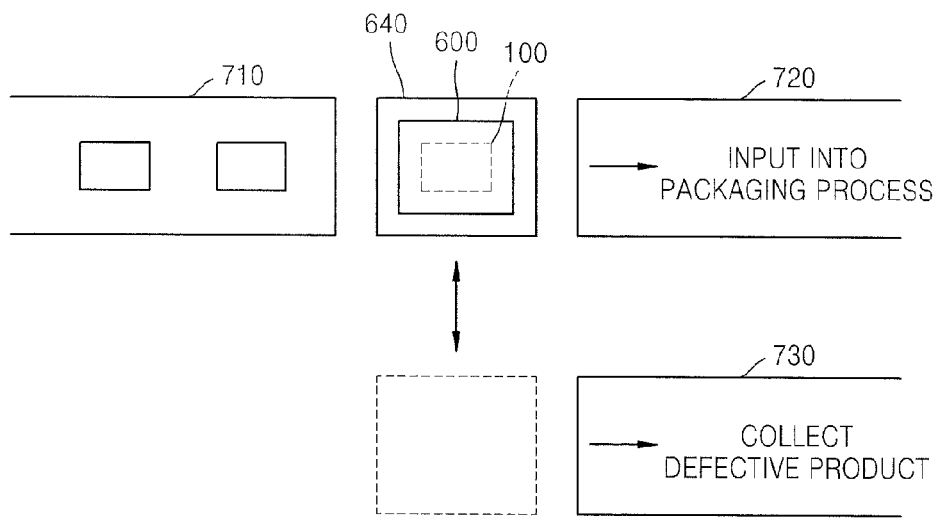
FIG. 7 is a schematic top view illustrating a magazine inspection system including the magazine inspection apparatus of FIG. 6.

The classification unit 640 may be configured to classify magazines determined to be normal and magazines determined to be defective and to divide and transfer the same. For example, as shown in FIG. 7, when a magazine 100 inspected by the magazine inspection apparatus 600 is normal, the classification unit 640 does not additionally transfer, thereby transferring the magazine from a first transfer unit 710 to a second transfer unit 720. Accordingly, a normal magazine may be input into a back-end process such as a packaging process. On the contrary, when the magazine 100 inspected by the magazine inspection apparatus 600 is defective, the classification unit 640 transfers, whereby the magazine 100 can be transferred from the first transfer unit 710 to a third transfer unit 730. Accordingly, a defective magazine may be additionally collected.

Figure 8:
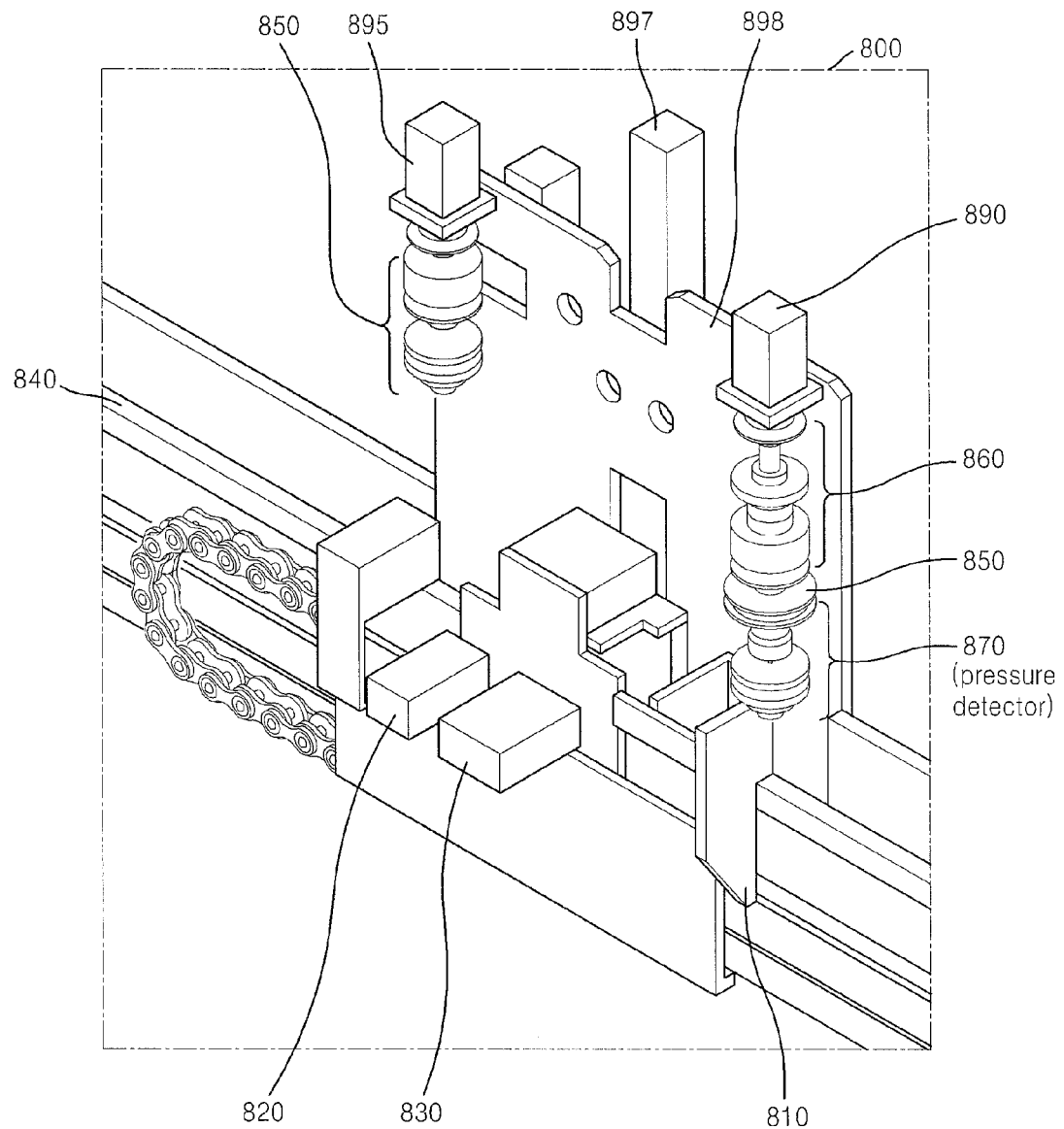
FIG. 8 is a perspective view illustrating a magazine inspection apparatus according to embodiments of the inventive concept.

FIG. 8 is a perspective view illustrating a magazine inspection apparatus 800 according to embodiments of the inventive concept. The magazine inspection apparatus 800 may include a control unit, a detection unit, a communication unit, and a classification unit, described with reference to FIG. 7. Hereinafter, a repetitive description thereof will be omitted for brevity.

Referring to FIG. 8, the detection unit may include a position detector 850, a pressure detector 870, and a torque detector 860. The position detector 850 may be configured to detect whether a stopper is located in a regular position or not. The position detector 850 may be embodied as, for example, a laser sensor.

The pressure detector 870 may be configured to detect a pressure generated by applying a force at, for example, pushing, the stopper. The torque detector 860 may be configured to detect a torque amount generated by rotating the stopper. The pressure detector 870 and the torque detector 860 may be top and bottom combined with each other. An intermediate connection unit 950 may be between the pressure detector 870 and the torque detector 860. The torque detector 860, the intermediate connection unit 950, and the pressure detector 870 are described in detail with reference to FIG. 9.

In FIG. 8, the detection unit can include one position detector 850, one pressure detector 870, and the torque detector 860, which are properly located by driving motors 890, 895, and 897, respectively, but are not limited thereto. At least one of the position detector 850, the pressure detector 870, and the torque detector 860 may be provided as a plurality thereof, respectively, and may be configured to detect whether each of the stoppers installed in the front and rear surfaces F and R (refer to FIG. 1) of the magazine is defective or not.

For example, the position detector 850 may be provided as a plurality thereof. That is, the position detector 850 may include a first position detector configured to detect a first position of the stopper and a second position detector configured to detect a second position that is different from the first position. When the position detector 850 is formed as a single as shown in FIG. 8, the position detector 850 may be transferred up, down, left, and/or right by the driving motors 895 and 897, thereby detecting the first position and the second position.

Overall operation of the magazine inspection apparatus 800 will be described in detail. The magazine transferred by a transfer unit 840 is suspended by a stopping unit 810 and an inspection operation with respect to the magazine starts. The magazine stopped by the stopping unit 810 may be located on a lifting unit 830 and may be transferred up and down by a driving motor 820. The abovementioned operation include a preparatory operation that allows the magazine to be located in a proper position, which is performed before a sensing operation that includes f a laser sensor of the position detector 850, a pressure detecting operation of the pressure detector 870, and/or a torque amount detecting operation of the torque detector 860.

A control unit may be configured to inspect whether i) a position detected by the position detector 850, ii) a pressure detected by the pressure detector 870, and iii) a torque amount detected by the torque detector 860 satisfy each and every of a predetermined set of conditions and/or whether to classify the magazines into normal ones and defective ones.

Figure 9:
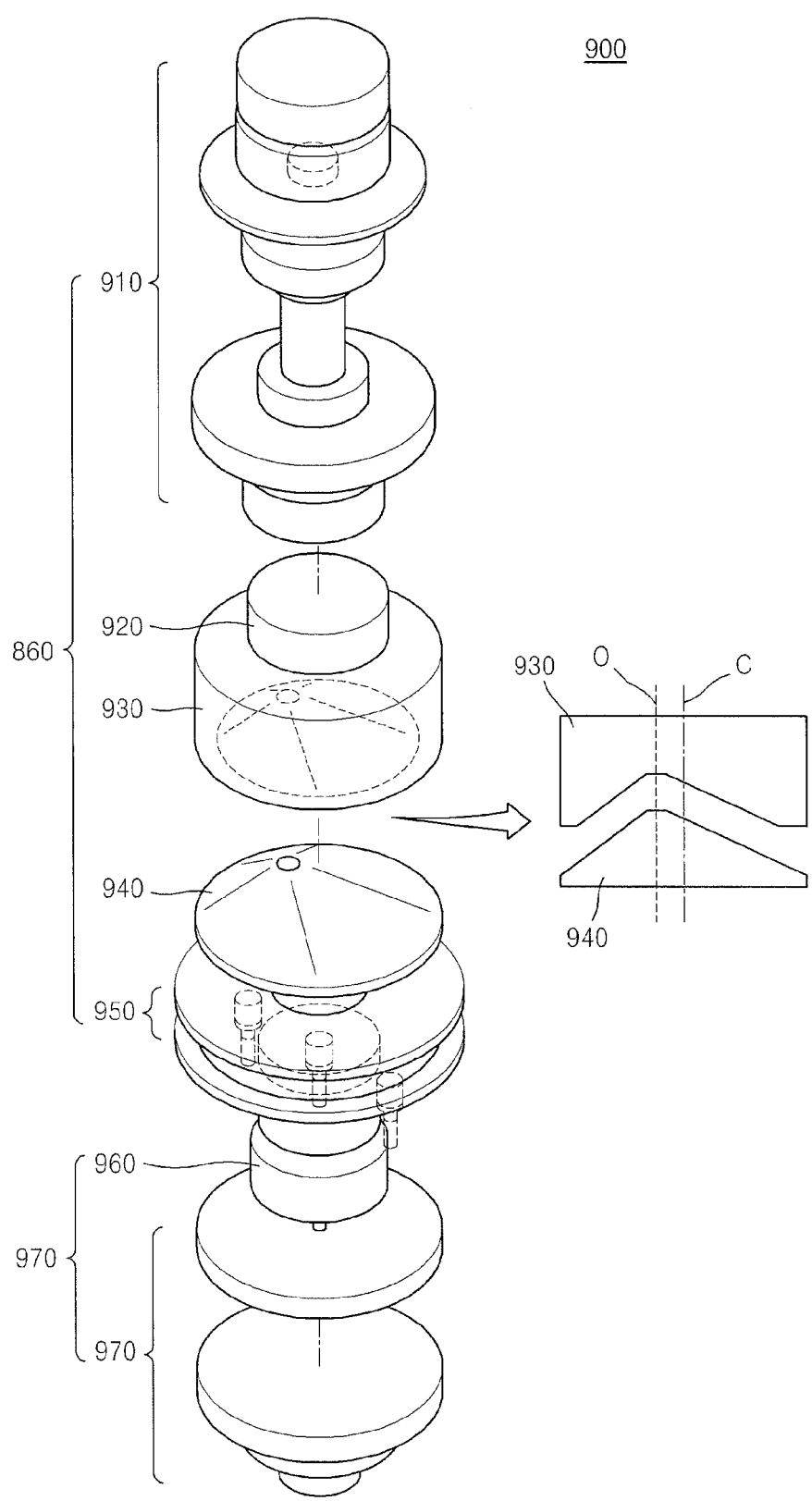
FIG. 9 is a detailed view illustrating a pressure detector a torque detector of FIG. 8.

FIG. 9 is a view illustrating the pressure detector 870 and the torque detector 860 in more detail.

Referring to FIG. 9, the pressure detector 870 may include at least one 960 of a piezoelectric device and a strain gage, which are constructed to measure a pressure. The pressure detector 870 may measure a pressure generated by transferring up and down the magazine located on the lifting unit 830 by the driving motor 820. For this, the pressure detector 870 may be mechanically connected to a surface of the stopper through a lower connection unit 970.

The torque detector 860 may be configured to measure a torque by measuring a pressure generated by applying a rotational force to the stopper not rotating regardless thereof. For this, the torque detector 860 may include a load cell 920, a first asymmetrical connection unit 940, and a second asymmetrical connection unit 930.

The load cell 920 may include a component that is identical or similar to that of at least one 960 of the piezoelectric device and the strain gage. The first asymmetrical connection unit 940 may be fastened to the stopper, and the second asymmetrical connection unit 930 may be fastened to the load cell 920. In more detail, the first asymmetrical connection unit 940 may be fastened to the stopper through the intermediate connection unit 950 and the lower connection unit 970.

The first asymmetrical connection unit 940 and the second asymmetrical connection unit 930 may be engaged with each other. For example, the first asymmetrical connection unit 940 may have a biased conic shape (for ex offset conic shape) formed based on an axis O separated from a central axis C and the second asymmetrical connection unit 930 may be engaged with the first asymmetrical connection unit 940 at a top region of the first asymmetrical connection unit 940.

When the driving motor 890 applies the rotational force through the upper connection unit 910, the second asymmetrical connection unit 930 rotates. According thereto, the first asymmetrical connection unit 940 rotates, thereby applying the rotational force to the stopper fastened to the first asymmetrical connection unit 940. Since the stopper may easily rotate due to the applied rotational force when the stopper is normal or non-defective, a pressure transferred through the lower connection unit 970, the intermediate connection unit 950, the first asymmetrical connection unit 940, the second asymmetrical connection unit 930, and the load cell 920 may be low.

On the other hand, when the stopper is defective, regardless of the applied rotational force, the stopper does not rotate. In this case, since the second asymmetrical connection unit 930 fastened to the load cell 920 may be about to rotate, or attempts to rotate, but the first asymmetrical connection unit 940 fastened to the stopper does not rotate, a pressure in a vertical direction may occur between the first asymmetrical connection unit 940 and the second asymmetrical connection unit 930. A pressure transferred to the load cell 920 may increase due to the pressure in the vertical direction.

The load cell 920 includes the at least one of a piezoelectric device and a strain gauge, shown at element 960, and can measure the pressure, thereby measuring a torque amount of the stopper. The control unit may receive information on the pressure, may determine a rotation of the stopper to be normal when the pressure is less than a numerical value, and may determine the rotation of the stopper to be abnormal when the pressure is the same as or greater than the numerical value.

Figure 10:
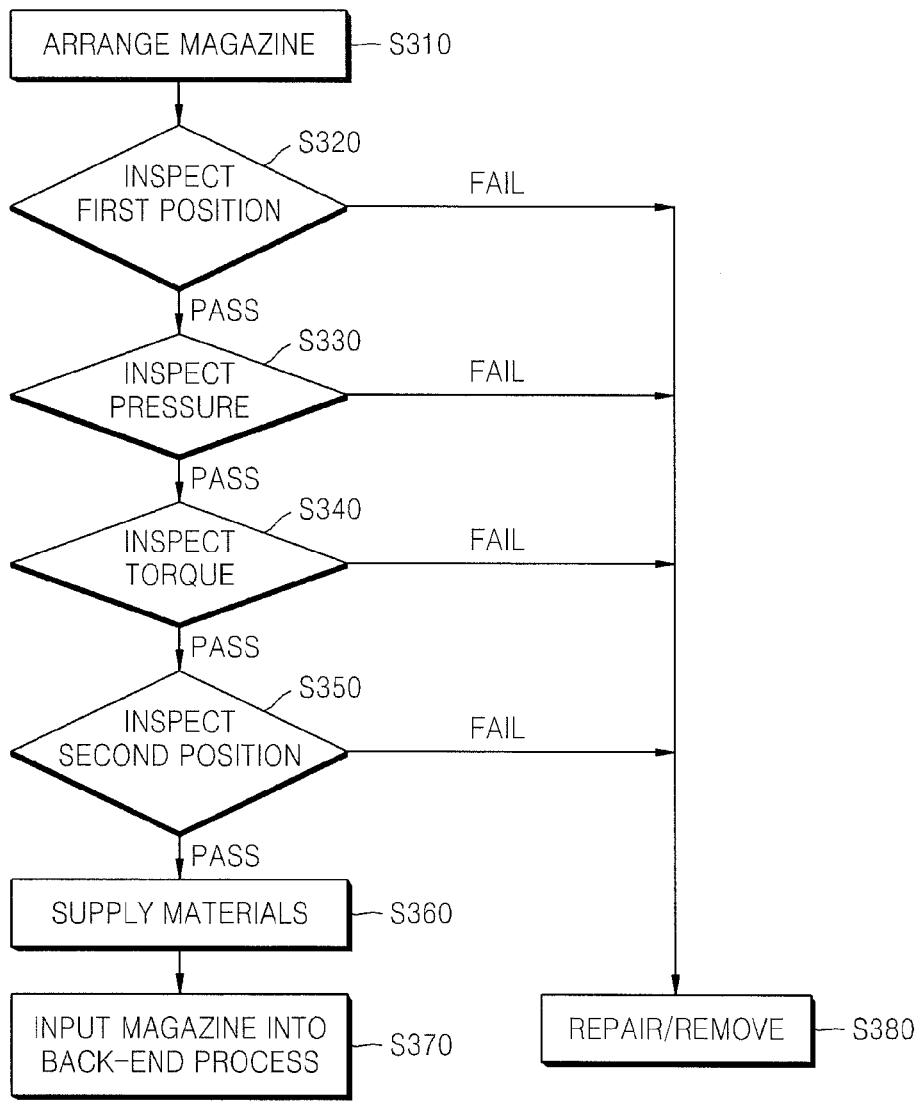
FIG. 10 is a flowchart illustrating a magazine inspecting method according to other embodiments of the inventive concept.

FIG. 10 is a flowchart illustrating a magazine inspecting method according to other embodiments of the inventive concept. In describing the method, reference is made to elements of a magazine inspection apparatus described herein, for example, apparatus 800.

Referring to FIG. 10, a magazine that is a target of inspection is prepared (S310). In operation S310, the magazine may be transferred by a transfer unit and then may be stopped by the stopping unit 810. The magazine stopped by the stopping unit 810 may be located on a lifting unit 830.

A determination can be made (S320) whether the stopper of the magazine is in a regular, or first, position (S320). In operation S320 where a first position is inspected, the position detector 850 such as a laser sensor may detect that the first position of the stopper is in a first unlocked state. A control unit may receive information on the first position and may determine the magazine to be defective when the first position is not within a predefined range. Here, the method can proceed to operation 5380 where repairing/removing the magazine determined to be defective may be performed.

Returning to decision diamond S320, when the first position is within the certain range, the method proceeds to operation S330, where a pressure on the magazine is inspected. The operation S330, the pressure detector 870 may apply a pressure to the stopper and may detect a reactive pressure of the stopper, generated by the applied pressure. The control unit may receive information on the pressure and may determine the magazine to be defective when the pressure is not within a certain range. Here, the method can proceed to operation 5380 where repairing and/or removing the magazine determined to be defective may be performed.

When the pressure is within the certain range, the method proceeds to operation S340, where a rotational torque of the magazine is inspected. Here, the torque detector 860 may apply a rotational force to the stopper and may detect a torque amount of the stopper, generated by the applied rotational force. The control unit may receive information on the torque amount and may determine the magazine to be defective when the torque amount is not within a predefined range. The method can proceed to operation 5380 where repairing and/or removing the magazine determined to be defective may be performed.

When the torque amount is within a predetermined range, a determination may be made whether the stopper of the magazine is in a regular position (S350), or second position. In the operation 5350 where the second position is inspected, the position detector 850 such as a laser sensor may detect that the second position of the stopper is in a second unlocked state. The control unit may receive information on the second position and may determine the magazine to be defective when the second position is not within a predefined range. The method can proceed to operation S380 where repairing/removing the magazine determined to be defective may be performed.

For example, the first unlocked state may include an unlocked state, at which the stopper is located in a groove of the magazine, before performing the pressure inspecting operation 5330 and the torque inspecting operation 5340 where a determination can be made whether the stopper normally operates based on the pressure and torque amount. On the other hand, the second unlocked state may include an unlocked state, in which the stopper is located in the groove of the magazine, after performing the pressure and torque inspecting operations 5330 and 5340. The first position and the second position may designate the same position of the stopper.

When the second position is within a certain range, the control unit may determine the magazine that is the target of inspection to be normal, e.g. non-defective. After that, following operations such as operation 5360 of supplying materials to the normal magazine and operation 5370 of inputting the magazine into a back-end process may be performed.

Figure 11:
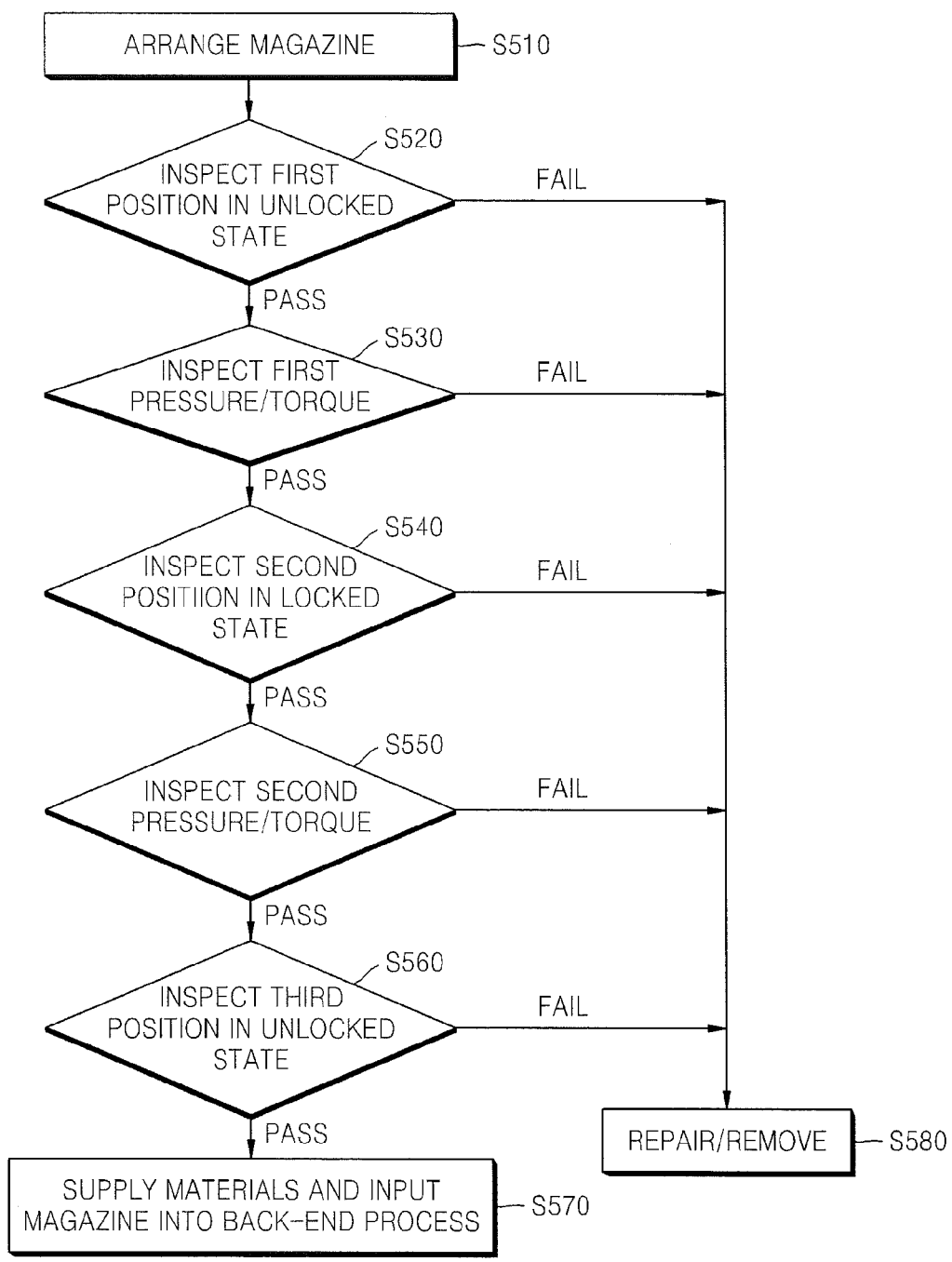
FIG. 11 is a flowchart illustrating a magazine inspecting method according to other embodiments of the inventive concept.

FIG. 11 is a flowchart illustrating a magazine inspecting method according to other embodiments of the inventive concept. The magazine inspection method of FIG. 11 may be a modified example of the magazine inspection method of FIG. 10. Hereinafter, a repetitive description will be omitted.

Referring to FIG. 11, a magazine is prepared (S510), a first position is inspected (S520), and a first pressure/torque are inspected (S530). A second position may subsequently be inspected (S540).

A stopper rotates at operation 5530, thereby locking the unlocked stopper. In this case, while the second position is being inspected, the second position of the stopper in a locked state, that is, a state where the stopper is fastened to the second mounting portion 20 (refer to FIG. 1) of the magazine, may be inspected. Accordingly, in this case, the second position may be different than the first position.

When the second position is within a predefined range, a second pressure/torque may be inspected (S550). The first pressure/torque inspection operation 5530 includes applying a pressure and a rotational force to the stopper to be converted from an unlocked state to a locked state. Here, the second pressure/torque inspection operation 5550 may apply a pressure and a rotational force to the stopper to be converted from the locked state to the unlocked state.

While the second pressure/torque is being inspected (S550), when the pressure and a torque amount are determined to be within certain ranges, a third position may be inspected (S560). The stopper rotates at operation 5530, thereby unlocking the locked stopper. In this case, while the third position is being inspected, the third position of the stopper when in a unlocked state, that is, a state where the stopper is fastened to the first mounting portion 19 (refer to FIG. 1) of the magazine, may be inspected. Accordingly, in this case, the third position may be the same as the first position.

As described above, a magazine inspection apparatus has been described referring to FIGS. 8 and 9 and a magazine inspection method has been described referring to FIGS. 10 and 11. However, the inventive concept is not limited to the embodiments and various inspection operations and configurations of an inspection apparatus may be derived according to needs of a user and operation conditions.

Figure 12:
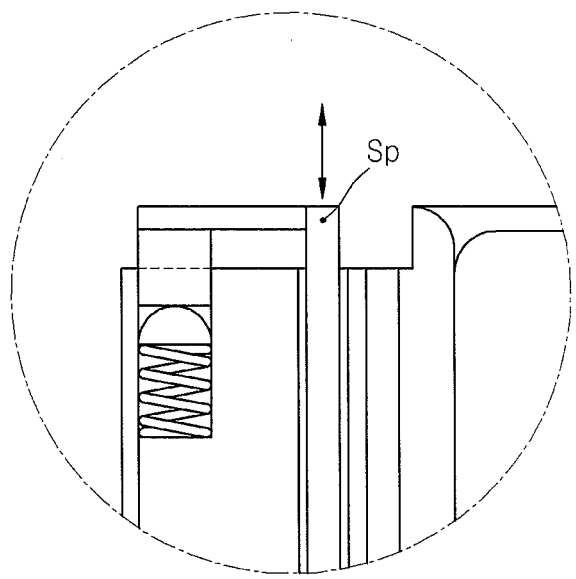
FIG. 12 is a view illustrating a state in which a position of a stopper is detected by a position detector during a position inspection operation according to some embodiments of the inventive concept.

FIG. 12 is a view illustrating a state in which a position of a stopper is detected by a position detector during a position inspection operation.

As shown in FIG. 12, during the position inspection operation, a position detector such as a laser sensor emits a laser to a top surface of the stopper 12, and more particularly, to a detection point SP and a reflection amount of the laser is detected, thereby detecting a position of the stopper 12. For this, the stopper 12 may be formed of a metallic material capable of reflecting a laser.

Selectively, when a stopper is formed of a non-reflective material such as plastic instead of the metallic material, a reflective portion may be attached to a top of the stopper. In FIG. 12, the laser can be emitted to the top surface of the stopper in a vertical direction. However, the laser may be emitted to a side of the stopper in a horizontal direction, thereby determining a regular position of the stopper.

Figure 13:
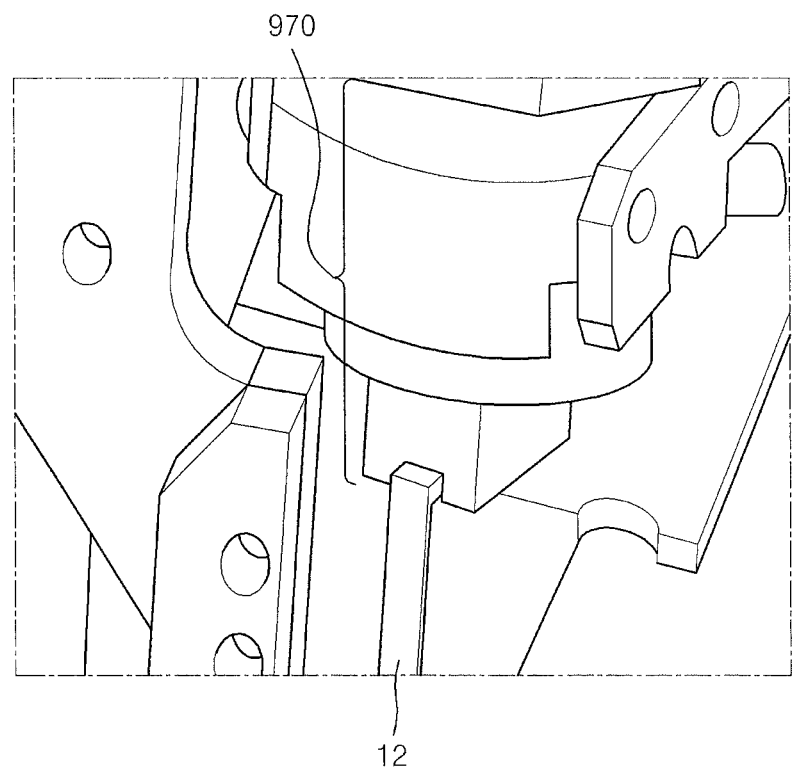
FIGS. 13 and 14 are views illustrating a state in which a pressure of the stopper is detected by a pressure detector during a pressure inspection operation according to some embodiments of the inventive concept.
Figure 14:
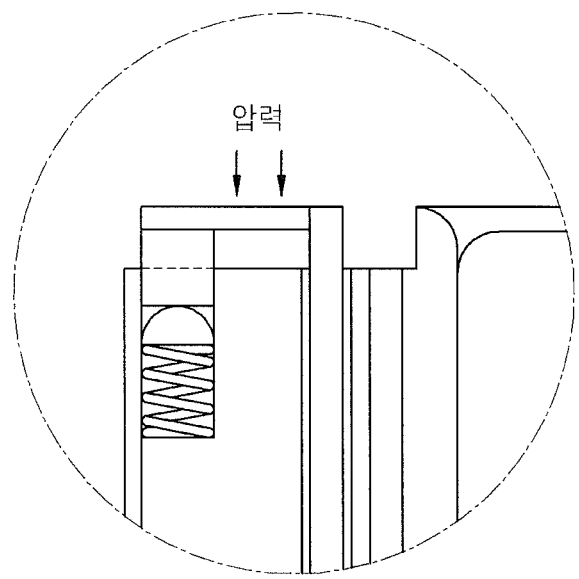

FIGS. 13 and 14 are views illustrating a state in which a pressure of the stopper 12 is detected, for example, by a pressure detector, during a pressure inspection operation.

As shown in FIGS. 13 and 14, during the pressure inspection operation, a lower connection unit 970 in the pressure detector may be mechanically fastened to the stopper, thereby applying a pressure in a vertical direction to the stopper.

When the stopper is normal, e.g., non-defective, since the stopper is pushed by the applied pressure, the pressure transferred to the pressure detector is low. On the other hand, when the stopper is defective, since the stopper is not pushed regardless of the applied pressure, the pressure transferred to the pressure detector may be higher due to a reactive pressure.

Figure 15:
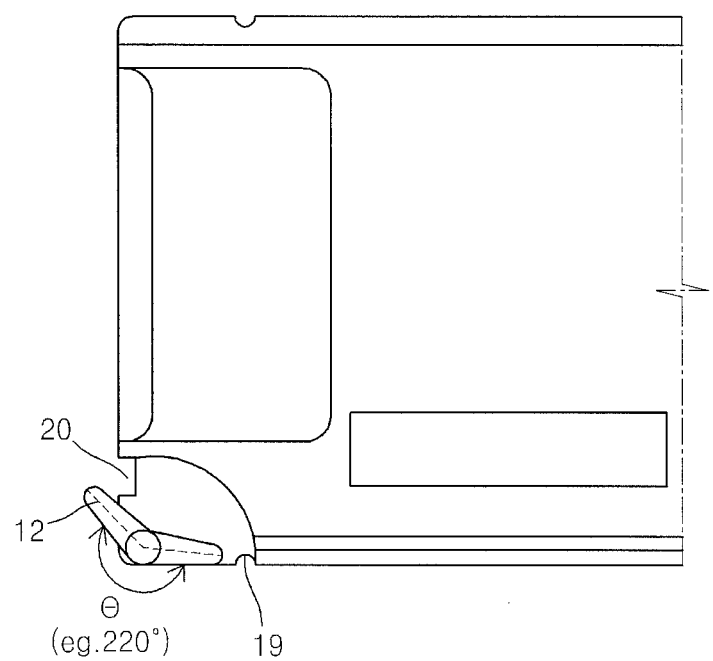
FIG. 15 is a view illustrating a state in which a torque amount of the stopper is detected by the torque detector during a torque inspection operation according to some embodiments of the inventive concept.

FIG. 15 is a view illustrating a state in which a torque amount of the stopper is detected by a torque detector during a torque inspection operation.

As shown in FIG. 15, during the torque inspection operation, a rotational force may be applied to the stopper through the lower connection unit 970. As an example, during the torque inspection operation, the stopper 12 may not perfectively rotate from the first mounting portion 19 to the second mounting portion 20 and may partially rotate, for example, 220 degrees with respect to the first mounting portion 19. As described in the embodiment, although the stopper 12 does not perfectly rotate, for example, 270 degrees but partially rotates, for example, from about 180 to about 260 degrees, and more particularly, 220 degrees, some, most, or all defects of the stopper may be detected.

FIGS. 16 to 25 are views schematically illustrating various examples of magazine defects, which can be detected from at least one of the first position inspection operation, the pressure inspection operation, the torque inspection operation, and the second position inspection operation performed by the inspection method of FIG. 10.

Figure 16:
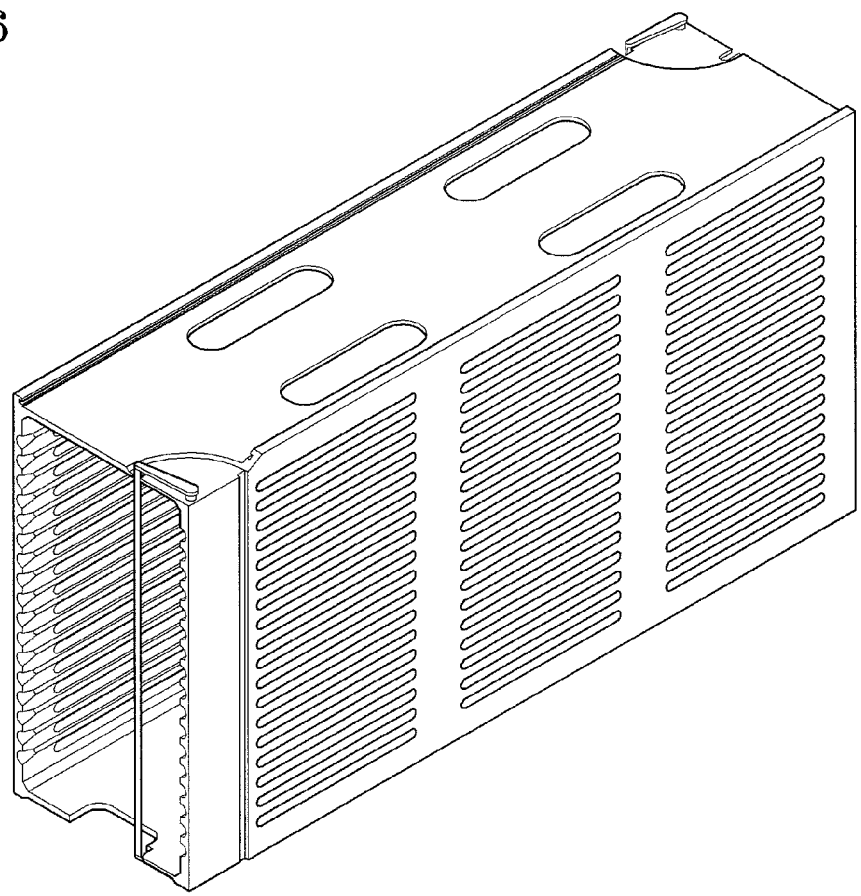
FIGS. 16 to 25 are schematic views illustrating examples of magazine defects, which are detected by the magazine inspection method of FIG. 10.
Figure 17:
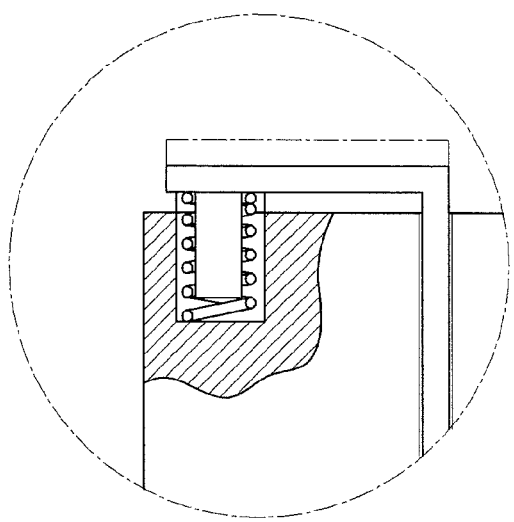
Figure 18:
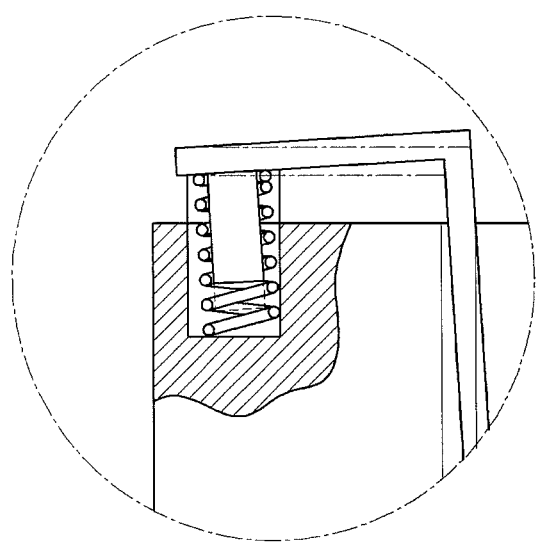

FIGS. 16 to 18 illustrate magazine defects, which may occur at a first position inspection operation, for example, described herein. FIG. 16 illustrates a defect in which although a magazine is normal, the magazine is inputted into an inspection apparatus while a stopper of the magazine is not in an unlocked state and is determined to be defective. FIG. 17 illustrates a defect in which although a stopper is in an unlocked state, the stopper is not fully lifted and is maintained as being partially inserted. FIG. 18 illustrates a defect in which a stopper is partially biased from a central axis. In this case, since a position of the stopper, measured by sensing operation of a laser sensor, is more than a certain reference value contrasted with a position of the stopper in a normal state, a defect of the magazine may be automatically detected.

Figure 19:
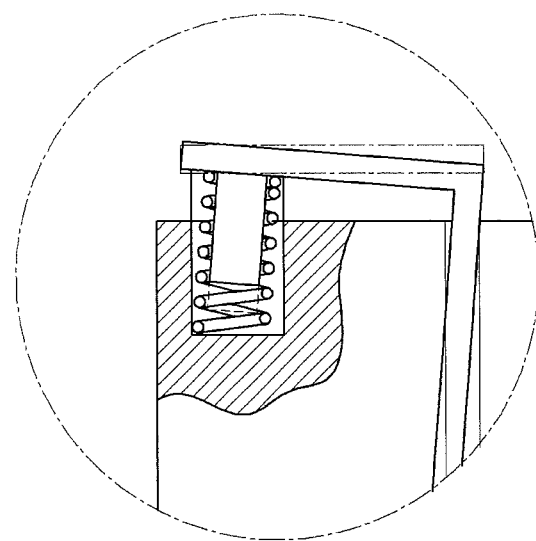
Figure 20:
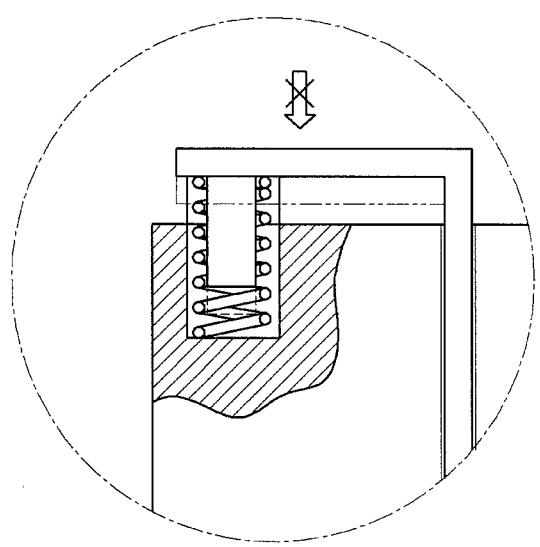
Figure 21:
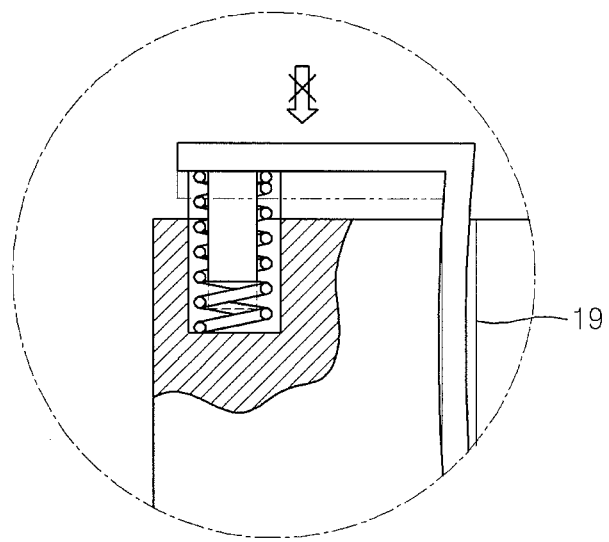

FIGS. 19 to 21 illustrate defects of magazines, which may occur in the pressure inspection operation. FIG. 19 illustrates a defect in which a stopper is bent and a reactive pressure excessively occurs while pushing the stopper. FIG. 20 illustrates a defect in which although a pressure is applied to a stopper, due to a defect of a component such as an inner fastening portion (not shown), the stopper does not descend and floats. FIG. 21 illustrates a defect in which when a stopper located in the first mounting portion 19 is bent and a reactive pressure occurs when pushing the stopper.

Figure 22:
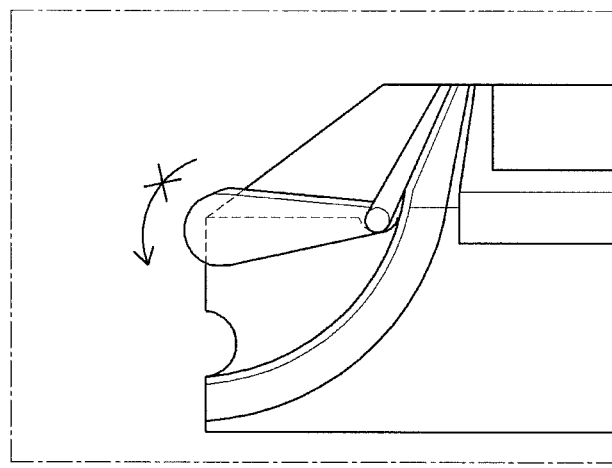
Figure 23:
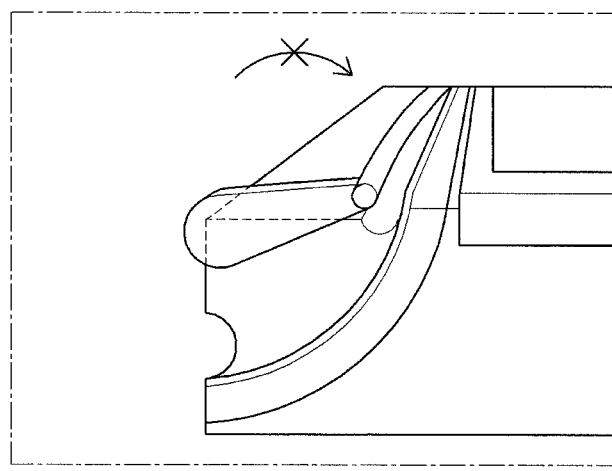

FIGS. 22 and 23 illustrate defects related to magazines, which may occur in the torque inspection operation. FIG. 22 illustrates a defect in which although a stopper is pushed and a rotational force is applied thereto, a mechanical combination between the stopper and an inner fastening portion (not shown) does not disappear. In addition, when a pin of the stopper is inserted into a groove and does not rotate or the stopper is bent, the defect shown in FIG. 22 may occur. FIG. 23 illustrates a defect in which since a bent stopper is capable of being out of the first mounting portion 19 but is not mounted in the first mounting portion 19 due to a bending thereof while returning to the first mounting portion 19.

Figure 24:
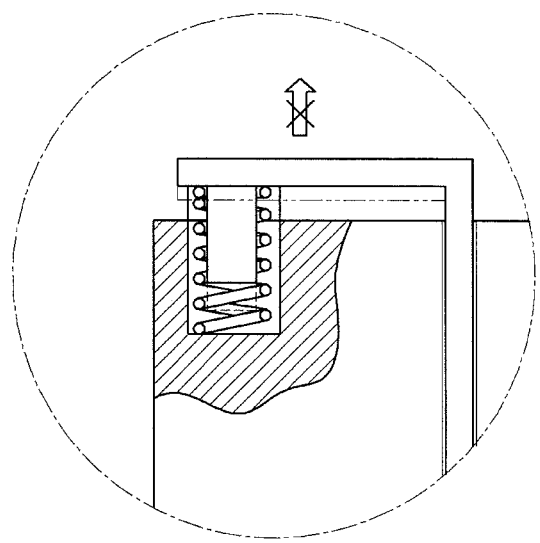
Figure 25:
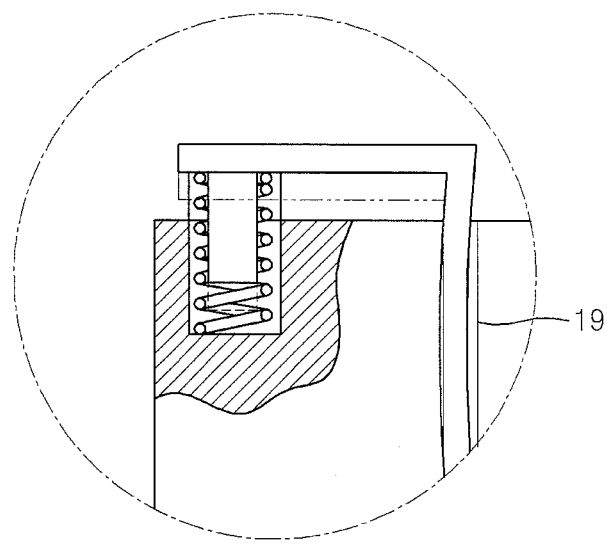

FIGS. 24 and 25 illustrate examples of a magazine, which may occur in the second position inspection operation. FIG. 24 illustrates a defect in which a stopper does not return or partially ascends even though a pressure is not applied. FIG. 25 illustrates a defect in which since a stopper does not precisely return to a first mounting portion 19 since the stopper is bent.

Figure 26:
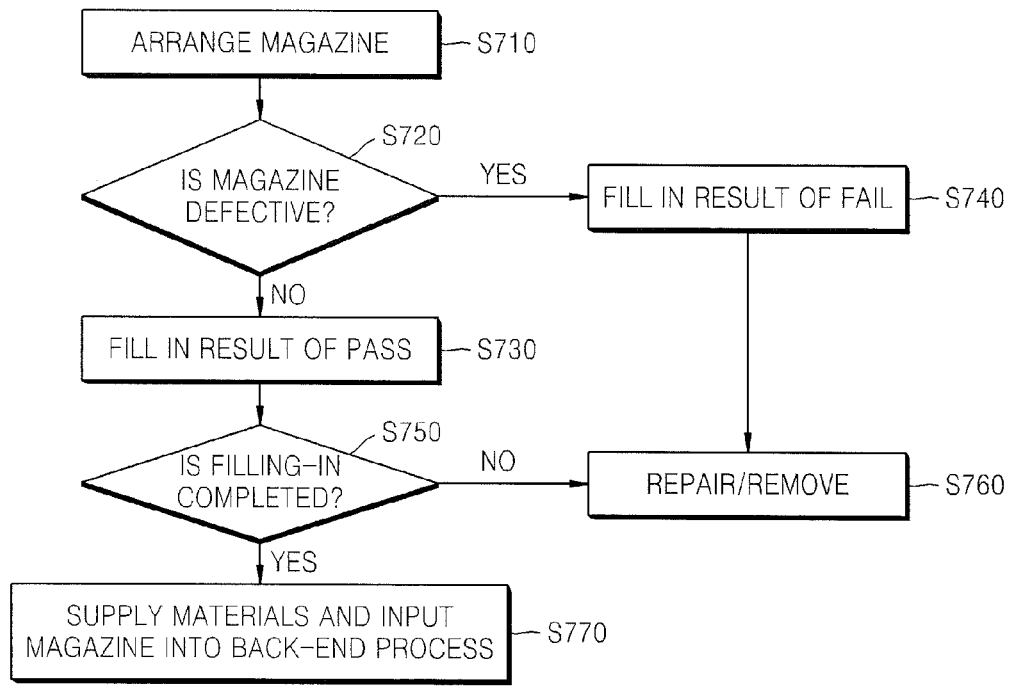
FIG. 26 is a flowchart illustrating a magazine inspecting method according to yet other embodiments of the inventive concept.

FIG. 26 is a flow chart illustrating a magazine inspection method according to yet other embodiments of the inventive concept. The method of FIG. 26 may be a modified example of the magazine inspection method described in other embodiments herein, for example, the method of FIG. 5. Hereinafter, a repetitive description will be omitted.

Referring to FIG. 26, a magazine is arranged (S710), a determination is made (S720) whether the magazine is defective or not (S720). When the magazine is determined to be defective, defective information is filled in relative to a fail state of the magazine. The defective information is filled in on a tag device mounted on the magazine (S730). The defective information, for example, may include an identification number indicating information regarding one or more defects described with reference to FIGS. 16 to 25. Otherwise, the method proceeds to operation 5740.

At operation 5740, when the magazine is determined to be normal (S740), normal information is filled in on the tag device mounted on the magazine. After that, it is inspected whether the normal information is filled in on the tag device of the magazine (S750). Operations 730, 740, and 750 may be performed by the communication unit 630 (refer to FIG. 6) and the control unit 610 the magazine inspection apparatus.

For example, the communication unit 630 may transmit one of the defective information and the normal information to the tag device of the magazine and the control unit 610 may receive a filling-in completion signal from the tag device and may determine whether or not the filling-in is completed. When the filling-in is completed, materials are supplied to the magazine and the magazine will be inputted into a back-end process (S770). On the contrary, when the filling-in is not completed, it can be determined to be a defect of the magazine. The magazine may be repaired or removed (S760).

According to the magazine inspection method of FIG. 26, a history of a magazine from an early stage of manufacturing to disuse may be managed. Accordingly, magazines may be systematically managed rather than general methods of manually removing defective magazines.

Figure 27:
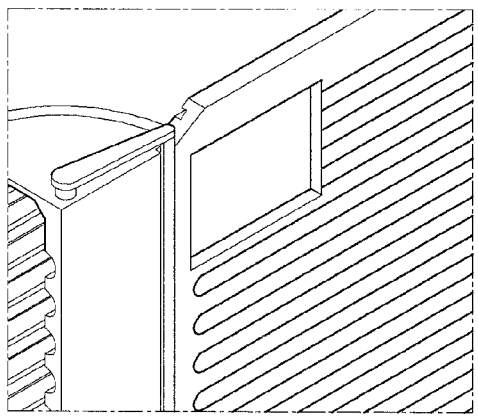
FIGS. 27 to 29 are schematic views illustrating magazine defects.
Figure 28:
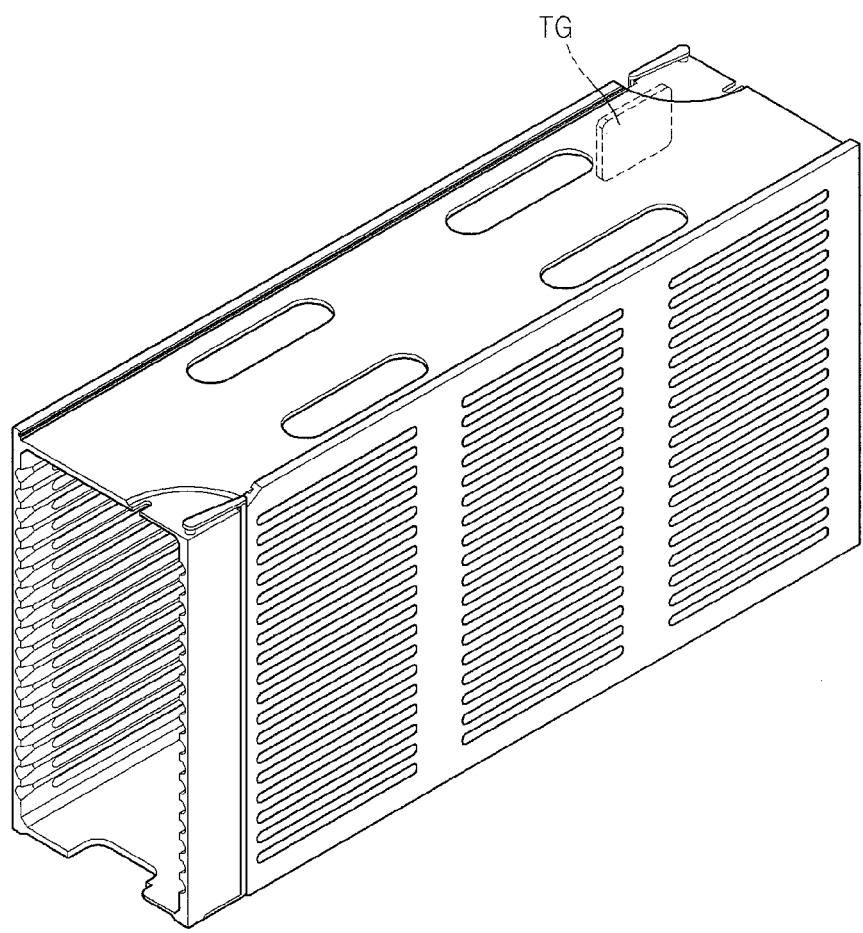
Figure 29:
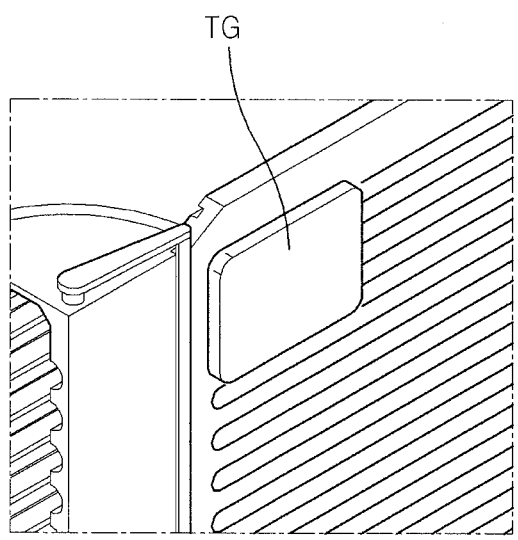

FIGS. 27 to 29 are views illustrating a type of defects of magazines, which may be detected in the filling-in inspection operation (S750) of the magazine inspection method of FIG. 26. FIG. 27 illustrates a defect in which a tag device is removed. FIG. 28 illustrates a defect in which a magazine is normal but is transferred while a front and a rear are reversed in such a way that a filling-in on a tag is not performed. FIG. 29 illustrates a defect in which a tag device TG is mounted on a magazine but loses its function due to a fault.

According to the magazine inspection method of FIG. 26, various defective magazines as shown in FIGS. 16 to 25 and 27 to 29 may be sorted out and only normal magazines may be inputted into a back-end process. Additionally, information on the kind of the defects is stored in a tag device of a magazine, a history of the magazine may be systemically managed.

Shapes of portions shown in the attached drawings in order to allow the inventive concept to be clearly understood are exemplary and may be modified as variously shapes in addition the shapes shown in the drawings. Like reference numeral refer to like elements.

While the inventive concept has been particularly shown and described with reference to exemplary embodiments thereof, it will be understood that various changes in form and details may be made therein without departing from the spirit and scope of the following claims.

What is claimed is:

1. An apparatus for inspecting a magazine including a plurality of partially-finished products, the magazine comprising a stopper that locks or unlocks the partially-finished products, the apparatus comprising:
   a position detector configured to detect a position of the stopper;
   a pressure detector configured to detect a pressure that, when generated, applies a force to the stopper; and
   a torque detector configured to detect a torque amount that, when generated, rotates the stopper,
   wherein the apparatus further comprises a control unit configured to inspect whether the position, the pressure, and the torque amount satisfy a set of predefined conditions, respectively, and, in response, to classify the magazine as either normal or defective.

2. The apparatus of claim 1, wherein the position detector is configured to detect the stopper in at least one of a first position at a first state and a second position at a second state.

3. The apparatus of claim 2, wherein the first state is a first unlocked state and the second state is a second unlocked state, wherein the first unlocked state is an unlocked state in which the stopper is located in a groove of the magazine before pressure and torque inspection operations are performed to determine whether the stopper normally operates based on the pressure and the torque amount, respectively, and wherein the second unlocked state is an unlocked state in which the stopper is located in the groove of the magazine after performing the pressure and torque inspection operations.

4. The apparatus of claim 1, wherein the torque detector comprises:
   a load cell comprising at least one of a piezoelectric device and a strain gauge;
   a first asymmetrical connection unit coupled to the stopper; and
   a second asymmetrical connection unit coupled to the load cell,
   wherein the first asymmetrical connection unit and the second asymmetrical connection unit engage each other.

5. The apparatus of claim 4, wherein the torque detector is configured to rotate the first asymmetrical connection unit and the stopper by rotating the second asymmetrical connection unit, and wherein the load cell measures a pressure when the stopper is not rotated, thereby measuring the torque amount.

6. The apparatus of claim 1, further comprising a communication unit configured to fill in defective information on a tag device of the magazine classified as defective.

7. An apparatus for inspecting a magazine including a plurality of partially-finished products, the magazine comprising a stopper that locks or unlocks the partially-finished products, wherein the apparatus comprises:
   a detection unit configured to inspect the stopper of the magazine before providing the magazine to a packaging process;
   a classification unit configured to classify the magazine comprising the stopper into a normal product; and
   a transfer unit configured to input only the magazine comprising the stopper classified as the normal product into the packaging process.

8. The apparatus of claim 7, comprising a first position detector configured to detect a first position of the stopper, the apparatus configured to classify the stopper into the normal product when the first position satisfies a predetermined condition.

9. The apparatus of claim 8, wherein the first position detector comprises a laser sensor configured to detect the first position by emitting a laser at a top surface of the stopper and detecting a reflection amount of the laser.

10. The apparatus of claim 8, comprising a second position detector configured to detect a second position of the stopper, the apparatus configured to classify the stopper into the normal product when the second position satisfies a predetermined condition.

11. The apparatus of claim 7, comprising a pressure detector configured to detect a pressure generated by pushing the stopper, the apparatus configured to classify the stopper into the normal product when the pressure satisfies a certain condition.

12. The apparatus of claim 11, wherein the pressure detector comprises at least one of a piezoelectric device and a strain gauge.

13. The apparatus of claim 7, comprising a torque detector configured to detect a torque amount generated by rotating the stopper, the apparatus configured to classify the stopper into the normal product when the torque amount satisfies a predetermined condition.

14. The apparatus of claim 13, wherein the torque detector is configured to measure the torque amount by measuring a pressure generated when a rotational force is applied to the stopper but the stopper does not rotate.

15. An apparatus for inspecting a magazine, comprising a stopper that locks or unlocks the partially-finished products in the magazine, the apparatus comprising:
- a detection unit that detects information regarding whether the stopper is defective;
- a communication unit that processes a signal that includes information on a type of defect occurring at the stopper;
- a classification unit that classifies the magazine as either normal or defective according to the information of the signal; and
- a control unit that determines whether the magazine is defective by receiving the signal from the detection unit.

16. The apparatus of claim 15, wherein the detection unit comprises at least one of a position detector configured to detect a position of the stopper, a pressure detector configured to detect a pressure that, when generated, applies a force to the stopper, and a torque detector configured to detect a torque amount that, when generated, rotates the stopper.

17. The apparatus of claim 16, wherein the apparatus inspects the stopper of the magazine before providing the magazine to a packaging process, and inputs the magazine classified as normal into the packaging process.

18. The apparatus of claim 16, wherein the position detector is configured to detect the stopper in at least one of a first position at a first unlocked state and a second position at a second unlocked state, wherein the first unlocked state is an unlocked state in which the stopper is located in a groove of the magazine before pressure and torque inspection operations are performed to determine whether the stopper normally operates based on the pressure and the torque amount, respectively, and wherein the second unlocked state is an unlocked state in which the stopper is located in the groove of the magazine after performing the pressure and torque inspection operations.

19. The apparatus of claim 15, further comprising a first transfer unit, a second transfer unit, and a third transfer unit, and wherein the classification unit transfers the magazine from the first transfer unit to the second transfer unit in response to the magazine classified as normal, and wherein the classification unit transfers the magazine from the first transfer unit to the third transfer unit in response to the magazine classified as defective.

* * * * *